(12) United States Patent
Ho et al.

(10) Patent No.: US 7,902,589 B2
(45) Date of Patent: Mar. 8, 2011

(54) DUAL GATE MULTI-BIT SEMICONDUCTOR MEMORY ARRAY

(75) Inventors: ChiaHua Ho, Kaohsiung (TW); Hang-Ting Lue, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 11/356,659

(22) Filed: Feb. 17, 2006

(65) Prior Publication Data

US 2007/0194365 A1 Aug. 23, 2007

(51) Int. Cl.
*H01L 29/792* (2006.01)

(52) U.S. Cl. .............................. 257/324; 257/E29.309

(58) Field of Classification Search .................. 257/326, 257/324, E29.309
See application file for complete search history.

(56) References Cited

U.S. PATENT DOCUMENTS

| | | | |
|---|---|---|---|
| 5,712,180 A * | 1/1998 | Guterman et al. | 438/263 |
| 6,011,725 A | 1/2000 | Eitan | |
| 6,320,786 B1 | 11/2001 | Chang | |
| 6,380,068 B2 | 4/2002 | Jeng | |
| 6,472,706 B2 * | 10/2002 | Widdershoven et al. | 257/314 |
| 6,590,266 B1 | 7/2003 | Liu | |
| 6,643,170 B2 | 11/2003 | Huang | |
| 6,649,971 B1 | 11/2003 | Yeh | |
| 6,762,467 B2 | 7/2004 | Jong | |
| 6,768,165 B1 | 7/2004 | Eitan | |
| 6,888,755 B2 | 5/2005 | Harari | |
| 2001/0000626 A1 * | 5/2001 | Kalnitsky et al. | 257/316 |
| 2003/0011020 A1 * | 1/2003 | Eitan | 257/314 |
| 2003/0053338 A1 * | 3/2003 | Mihnea et al. | 365/185.18 |
| 2003/0146465 A1 * | 8/2003 | Wu | 257/314 |
| 2004/0042270 A1 | 3/2004 | Huang | |

FOREIGN PATENT DOCUMENTS

| | | |
|---|---|---|
| TW | 480656 | 3/2002 |
| TW | 541690 | 7/2003 |

OTHER PUBLICATIONS

"Office Action of Taiwan counterpart application", issued on Jan. 12, 2010, p. 1-5.

* cited by examiner

*Primary Examiner* — Bradley K Smith
*Assistant Examiner* — Amar Movva
(74) *Attorney, Agent, or Firm* — Jianq Chyun IP Office

(57) ABSTRACT

An array of memory cells is arranged in columns and one or more rows on a semiconductor substrate. Each cell has a source, a drain, a first gate and a second gate. The array includes a plurality of gate control lines, each of which corresponds to one of the columns of the memory cells, where each control line connects to the first gate of the memory cell in the corresponding column in each of the rows; and one or more word lines, each of which corresponds to one of the rows of the memory cells, where each word line connects to the second gate of each of the cells in the corresponding row.

20 Claims, 15 Drawing Sheets

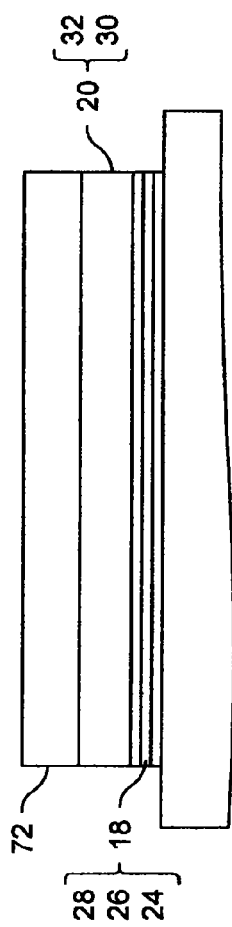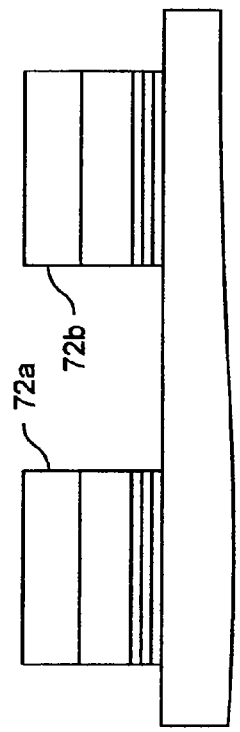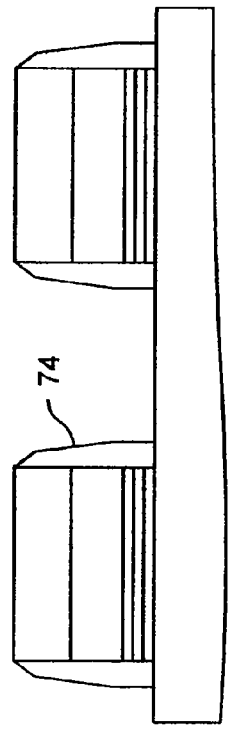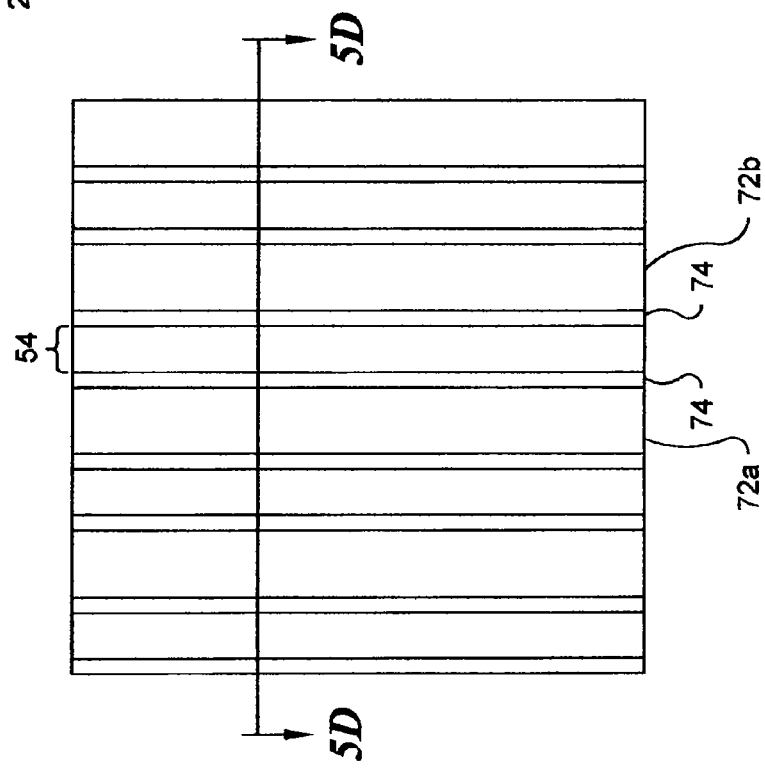

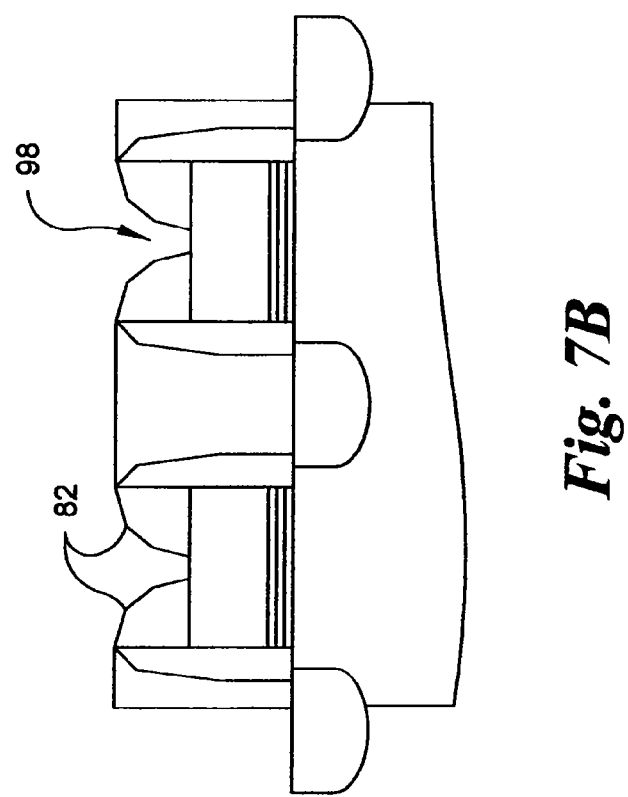
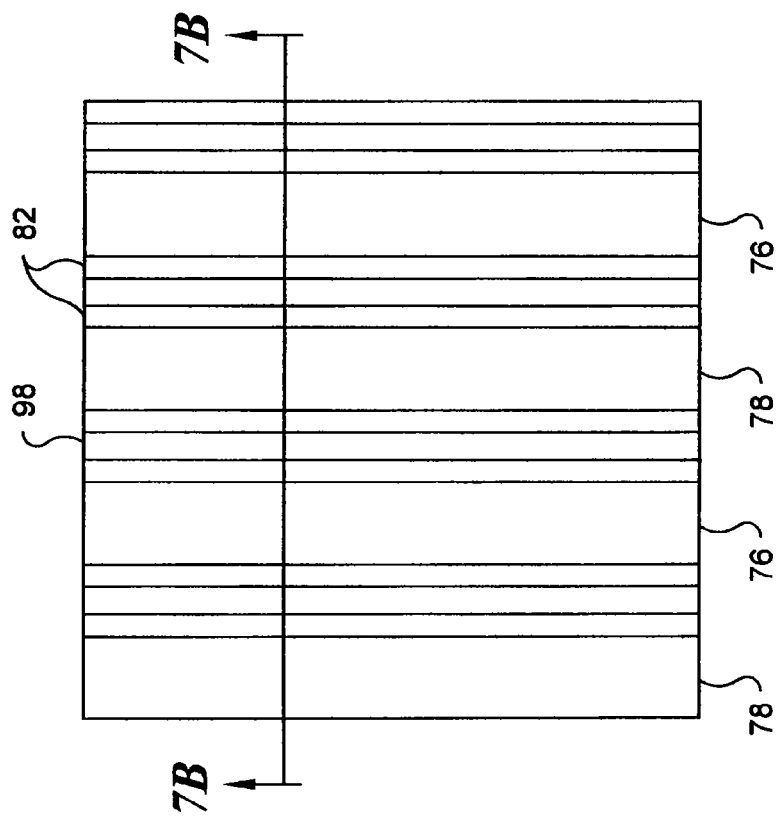
Fig. 7B
Fig. 7A

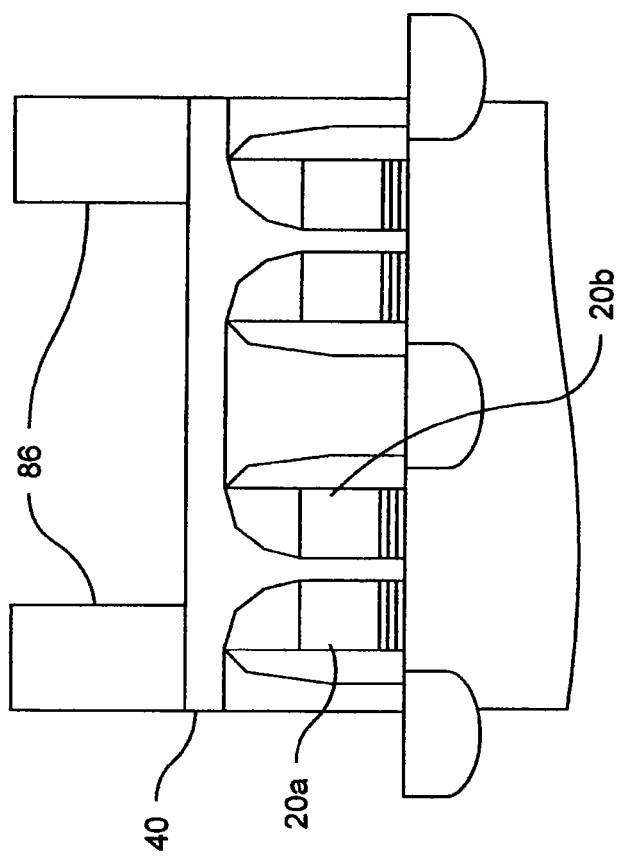
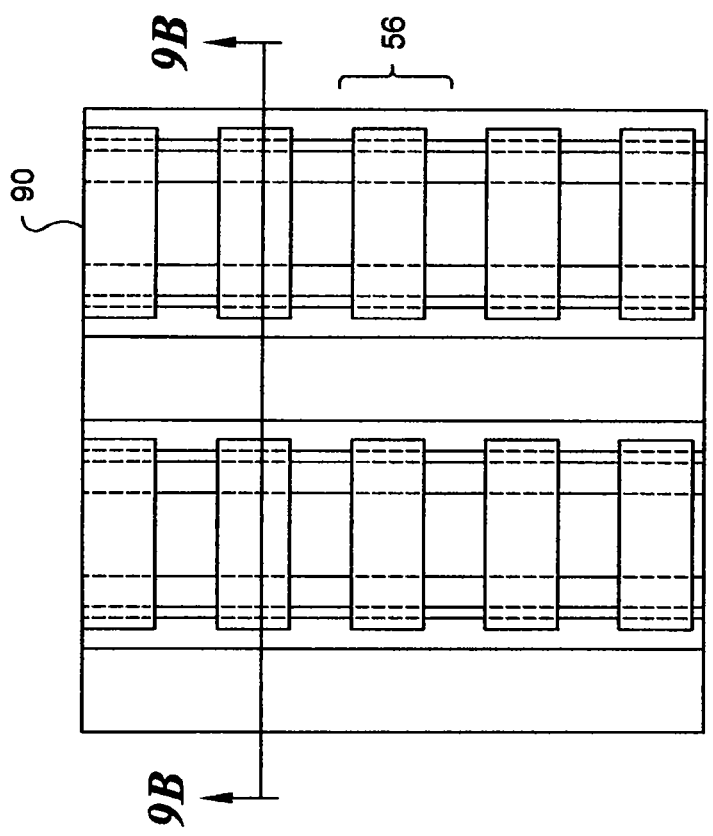
Fig. 9B
Fig. 9A

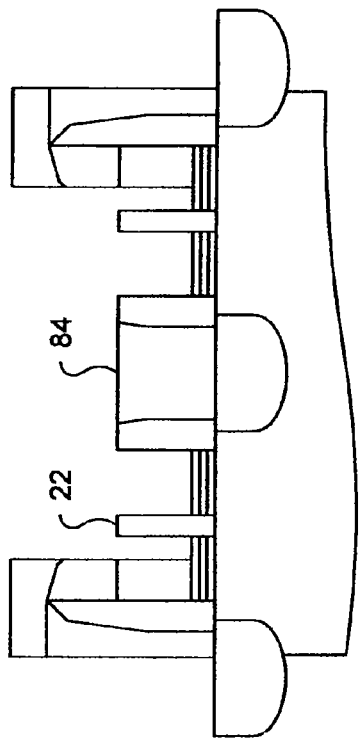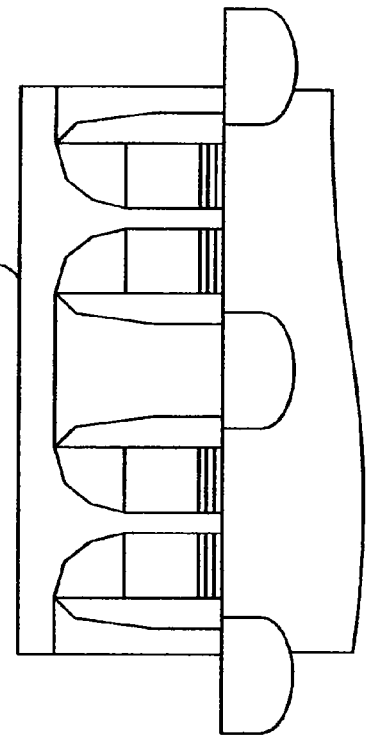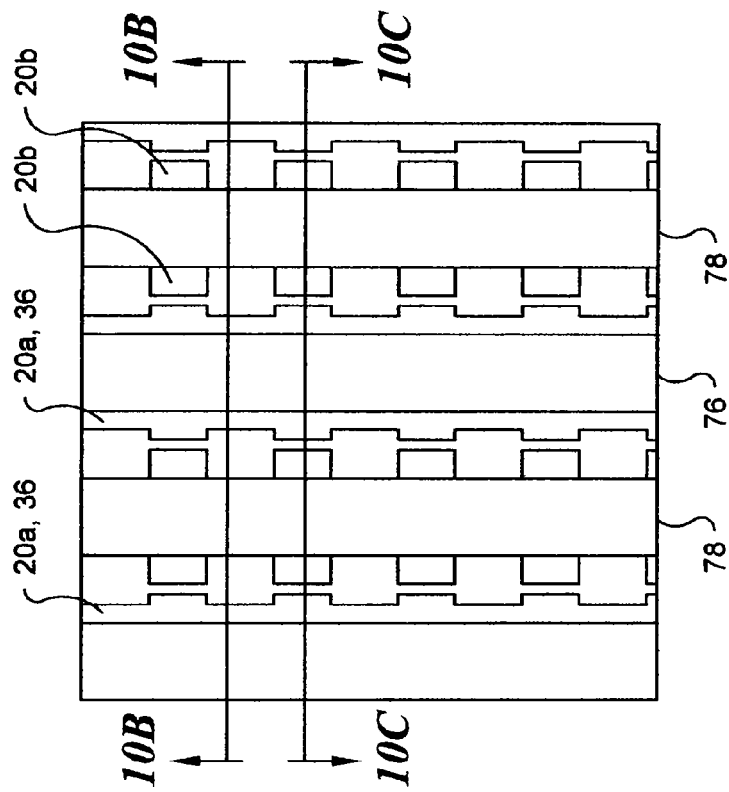

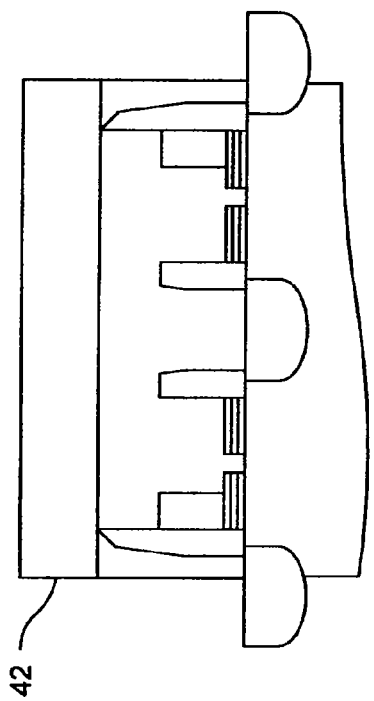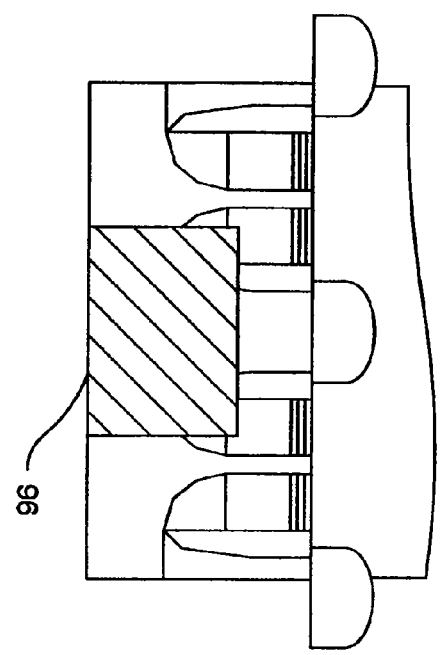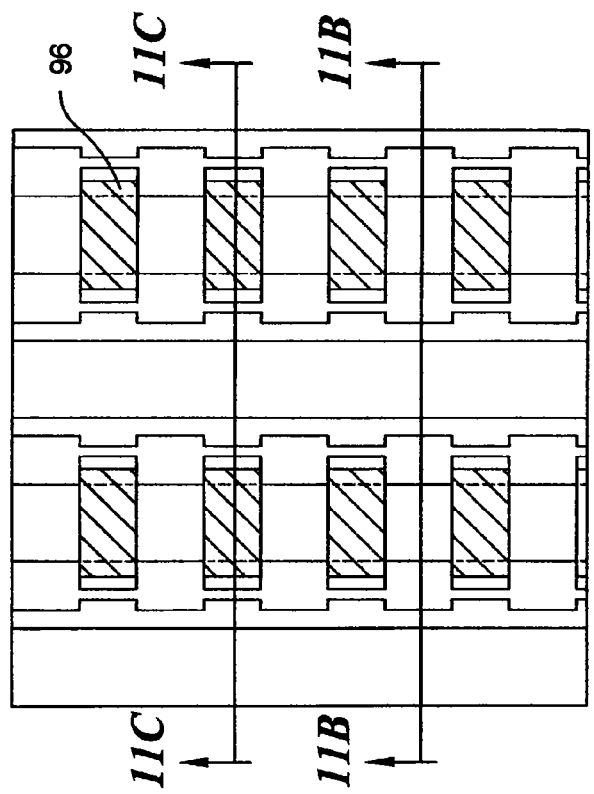

DUAL GATE MULTI-BIT SEMICONDUCTOR MEMORY ARRAY

CROSS REFERENCE TO RELATED APPLICATIONS

This application is related to application Ser. No. 11/234,983 filed Sep. 26, 2005 entitled "Dual-Gate Multi-Bit Semiconductor Memory".

BACKGROUND OF THE INVENTION

1. Field of the Invention

The present invention relates to an array of nitride read only memory (NROM) cells. More particularly, the present invention relates to a NROM memory array in which each cell has two independently controllable gates.

2. Description of Related Art

A conventional NROM cell comprises a P-type substrate on which is formed an oxide/nitride/oxide (ONO) stacked layer structure, with the silicon nitride layer serving as an electron trapping layer. A control gate structure of a conducting polycrystalline layer is formed on the silicon oxide/silicon nitride/silicon oxide layer. An N+ source region and an N+ drain region are located in the substrate on either side to the gate structure.

The conventional NROM cell can store two bits of information, one bit of information being stored as the presence or absence of negative charges in the trapping layer at the side of the source region and one bit of information being stored as the presence or absence of negative charges in the trapping layer at the side of the drain region. The bit information at the source and the drain regions is separately read by detecting the presence of absence of current flowing between the source and the drain when appropriate voltages are applied to the gate, the source and the drain. However, in reading one of the two bits of data in the conventional NROM cell, the magnitude of the current that travels between the source and the drain regions may be affected by the presence or absence of the other bit of data. This is called the second-bit effect. The presence of the second-bit effect makes less reliable, the reading of a state of the cell.

In addition to the second bit effect, when NROM cells are configured in an array, a so called array effect may occur, which results in an incorrect reading of the state of a cell. The array effect is caused by leakage currents from adjacent memory cells. Accordingly, it would be desirable for an NROM cell to have the capability of storing two bits of data where the presence of absence of one bit of the data does not influence the detection of the state of the other bit of data and where leakage currents from adjacent cells in an array which could effect the reliability of detecting the state of a cell are not generated.

BRIEF SUMMARY OF THE INVENTION

Briefly stated, the present invention comprises an array of memory cells arranged in rows and columns on a semiconductor substrate, each cell having a source, a drain, a first gate and a second gate. The array comprises a plurality of gate control lines, each of which corresponds to one of the columns of the memory cells, wherein each control line connects to the first gate of the memory cell in the corresponding column in each of the rows, and at least one word line, each of which corresponds to one of the rows of the memory cells, wherein each word line connects to the second gate of each of the cells in the corresponding row.

The present invention further comprises a method for making an array of memory cells on a substrate comprising the steps of: depositing on the substrate a plurality of columns, each column comprising a dielectric layer and a conductive layer; removing the dielectric layer and the conductive layer at a center portion of each column to form a nanospace having a predetermined width, thereby separating each column into a first portion and a second portion; and patterning each column to form a plurality of rows of connected first gates in the first portion and disconnected second gates in the second portion.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIGS. 5A-5D include a plan view and a series of cross sectional views of the array in the stage of depositing on a substrate, a charge trapping layer and a gate structure of the memory element of FIG. 2;

FIGS. 7A-7B include a plan view and a cross sectional view of the array in the stage of hard mask lift-off and forming a dielectric spacer;

FIGS. 9A-9B include a plan view and a cross sectional view of the array in the stage of depositing an inter-space dielectric and a photolithographic layer;

FIGS. 10A-10C include a plan view and cross sectional views of the array in the stage of gate 2 patterning;

FIGS. 11A-11C include a plan view and cross sectional views of the array in the stage of depositing an interlayer dielectric and word line contacts;

DETAILED DESCRIPTION OF THE INVENTION

Figure 1:
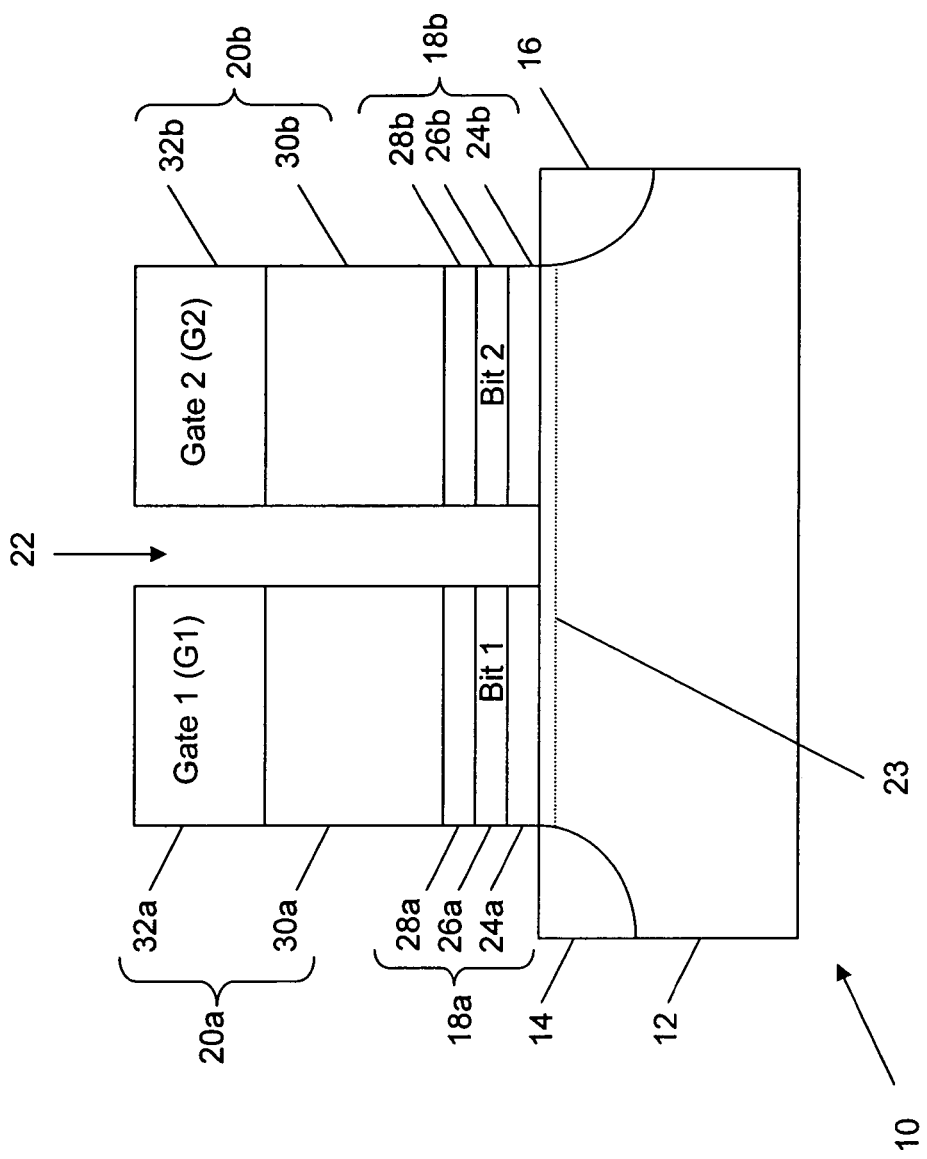
FIG. 1 is a cross sectional view of a memory cell in accordance with a preferred embodiment.

Referring to the drawings, wherein like numerals are used to indicate like elements throughout the several figures and the use of the indefinite article "a" may indicate a quantity of one, or more than one of an element, there is shown in FIG. 1 a cross sectional view of a preferred embodiment of an NROM non-volatile memory cell 10 (hereafter cell 10) in accordance with a preferred embodiment of the present invention. The cell 10 comprises a substrate 12 having a drain region 14 (hereafter drain 14) and a source region 16 (hereafter source 16). It would be understood that the drain 14 and the source 16 are named as such only for the purpose of naming the parts of the cell 10 and that the drain 14 may assume the function of a source of electrons and the source 16 may assume the function of a drain of electrons depending upon the voltages applied to the cell 10.

In the preferred embodiment of the cell 10, a channel 23, having an approximate length of 0.12 μm., is located in the substrate 12 between the drain 14 and the source 16. Preferably, the substrate 12 is a P-type material and the drain 14 and the source 16 are each N+ regions. However, the substrate may be an N type material and the drain 14 and the source 16 may be P+ regions and still be within the spirit and scope of the invention.

In the preferred embodiment of the cell 10, an oxide, nitride, oxide (ONO) charge trapping layer 18 (FIG. 5B) consisting of a first portion 18a proximate to the drain 14 and a second portion 18b proximate to the source 16 overlays the channel 23 between the drain 14 and the source 16. The first and the second portions 18a, 18b of the charge trapping layer 18 are separated from each other by a nanospace 22, having a length of approximately 30 nm., filled with a dielectric. In the preferred embodiment, the charge trapping layer 18 comprises, a first silicon oxide dielectric layer 24 (FIG. 5B) of portions 24a, 24b, a silicon nitride dielectric layer 26 (FIG. 5B) composed of portions 26a, 26b and a second silicon oxide dielectric layer 28 (FIG. 5B) of portions 28a, 28b.

In the preferred embodiment, a gate layer 20 (FIG. 5B) composed a first gate 20a (G1) is formed proximate to the drain 14 and a second gate 20b (G2) is formed proximate to the source 16 over each portion of the charge trapping layer 18a, 18b. Preferably, the first and the second gates 20a, 20b, comprise: (i) polycrystalline silicon portions 30a, 30b formed from a polycrystalline layer 30 (FIG. 5B), and (ii) metal silicide portions 32a, 32b formed from a metal silicide layer 32 (FIG. 5B).

The cell 10 is configured for independently storing a first bit (bit 1) of information in the nitride layer 26a proximate to the drain 14 and storing a second bit in the nitride layer 26b proximate to the source 16. Each of the bits may independently assume a programmed state, i.e. "0" state, or an erased state, i.e. "1" state. In the erased state, the nitride layer 26 in the vicinity of the respective source region 16 or drain region 14 is substantially devoid of electrical charges. In the erased state a first threshold voltage is required to be exceeded for inducing a current flow in the channel 23. In the programmed state, substantial negative charges are stored in the nitride layer 26 in the vicinity of the respective drain 14 or source 16 such that a voltage exceeding a second threshold, substantially greater than the first threshold, is required for inducing a current flow in the channel 23. Consequently, appropriately applied voltages to the first gate 20a, to the second gate 20b, and to the respective drain 14 and source 16 provide for programming and erasing the cell 10 and for reading the cell 10 to determine whether the first and the second bits in the cell 10 are in a programmed state or in an erased state.

Figure 2:
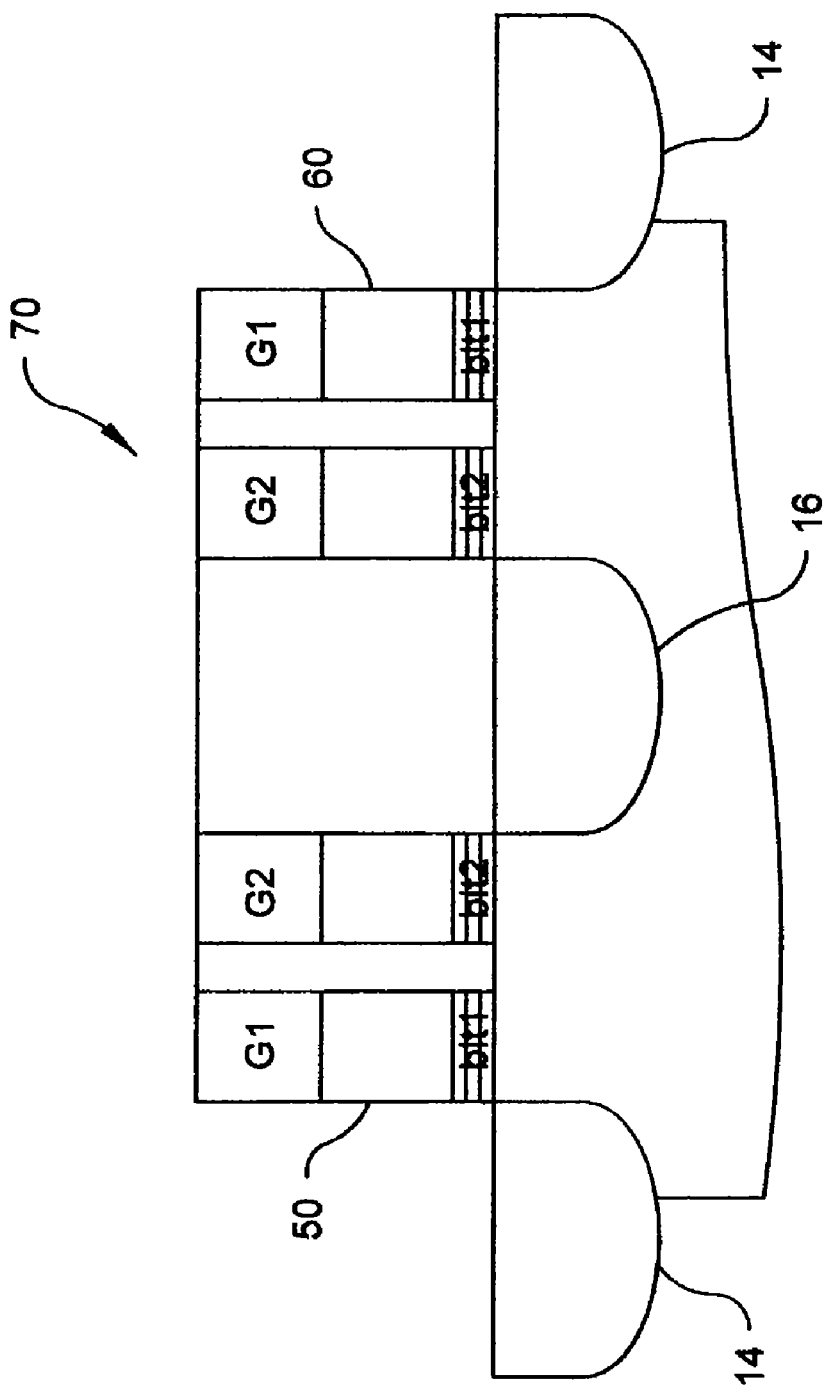
FIG. 2 is a cross sectional view of a memory element incorporating the memory cell of FIG. 1.

Referring now to FIG. 2, there is shown a cross-section of a first NROM memory cell 50 and a second memory cell 60 configured to form a memory element 70. The first memory cell 50 and the second memory cell 60 are each substantially identical to the NROM cell 10.

Figure 3:
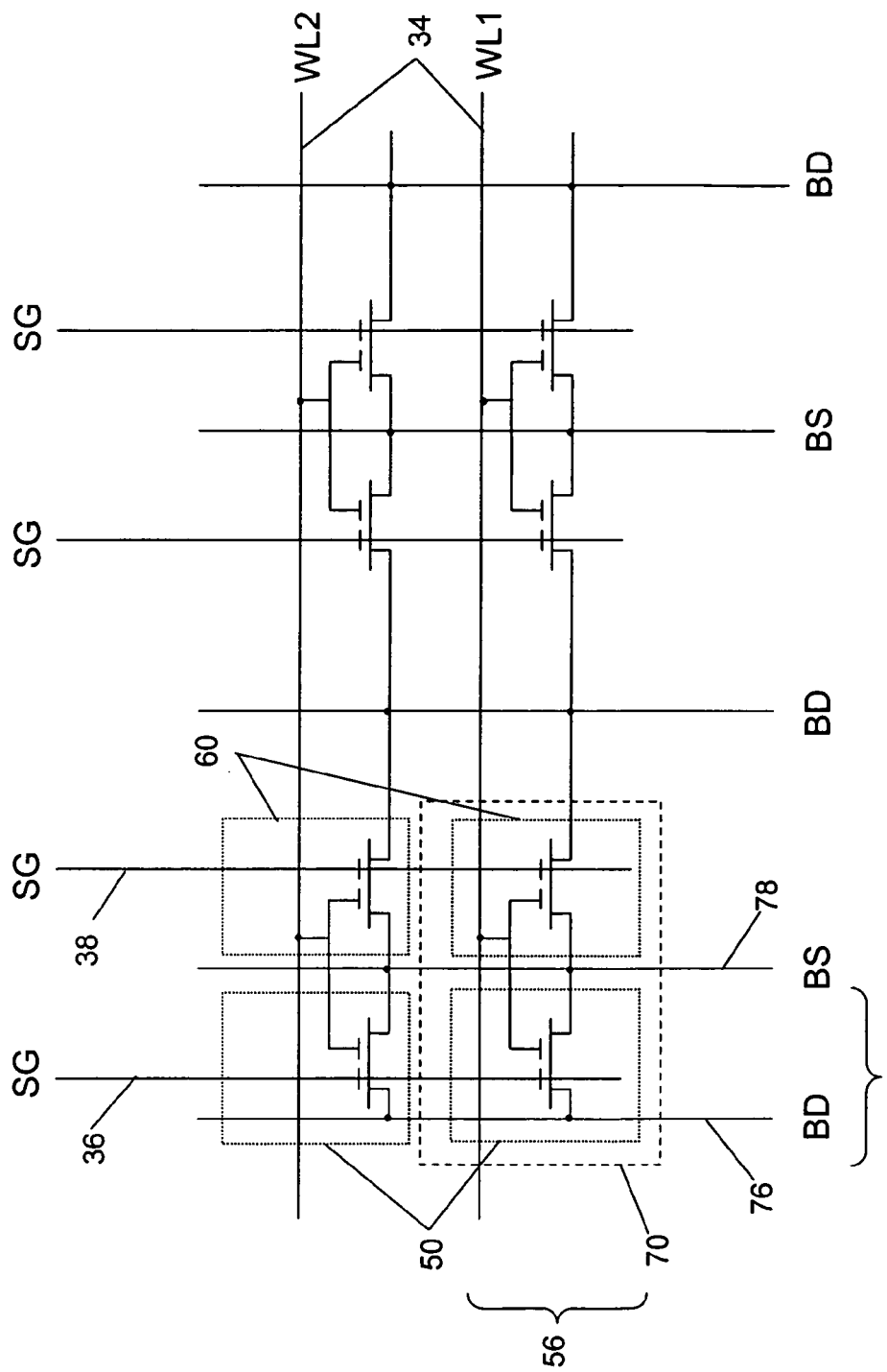
FIG. 3 is an electrical schematic of an array of the memory elements shown in FIG. 2.
Figure 4:
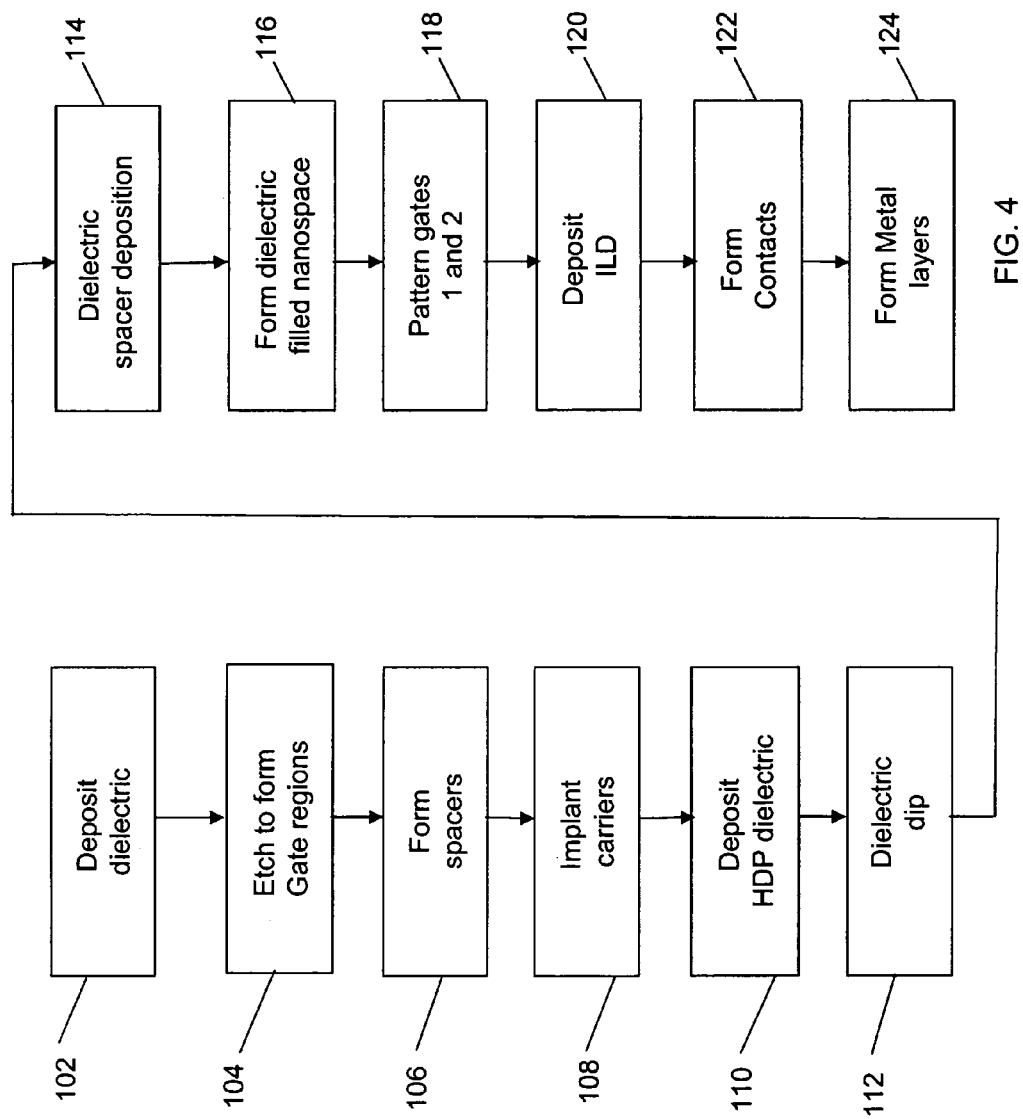
FIG. 4 is a flow diagram of a process for making the array shown in FIG. 3.
Figure 6B:
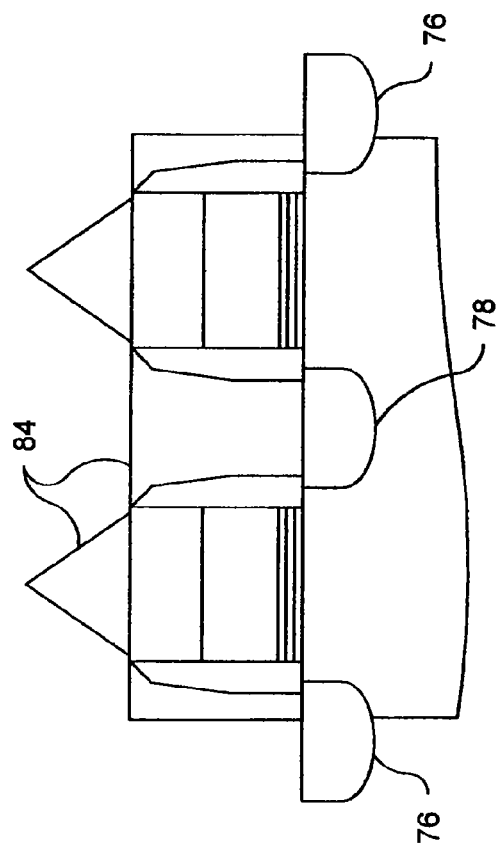
FIGS. 6A-6B include a plan view and cross sectional view of the array in the stage of forming bit lines and depositing an HDP dielectric.
Figure 6A:
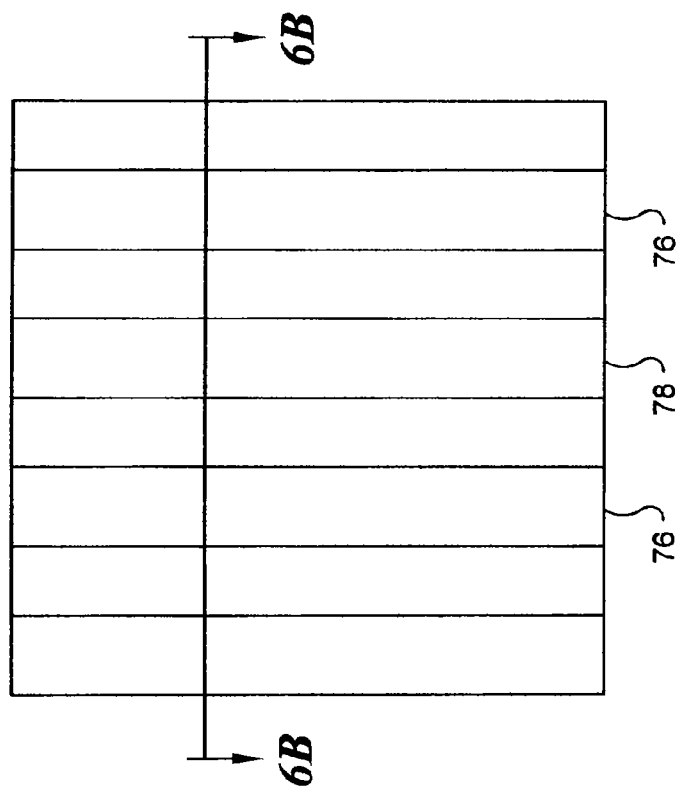
Figure 8B:
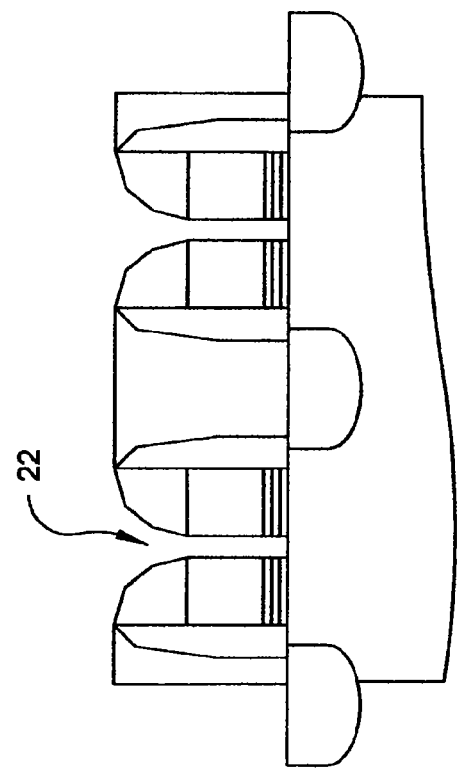
FIGS. 8A-8B include a plan view and a cross sectional view of the array in the stage of forming a nanospace.
Figure 8A:
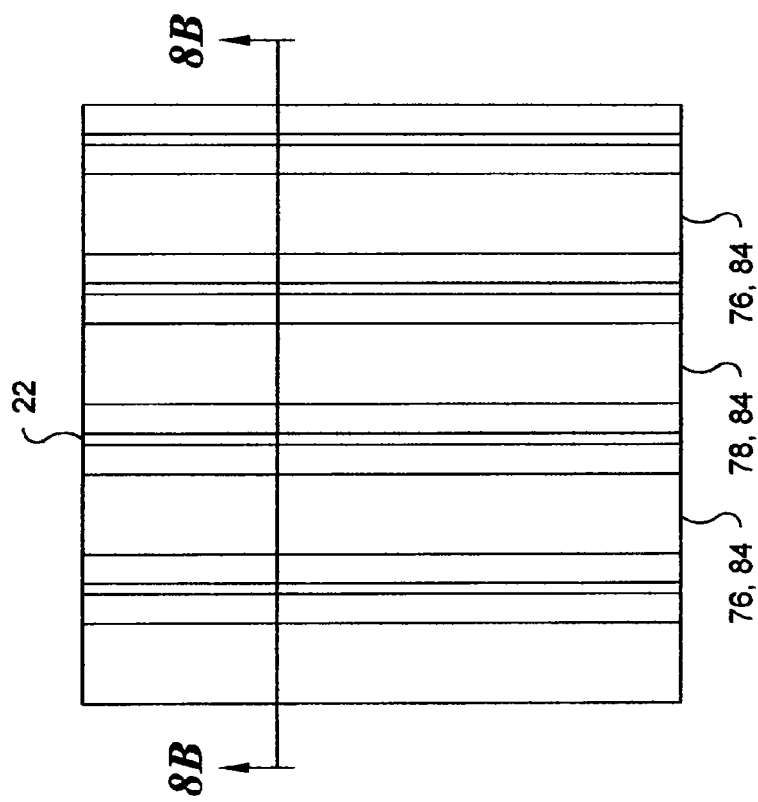
Figure 12B:
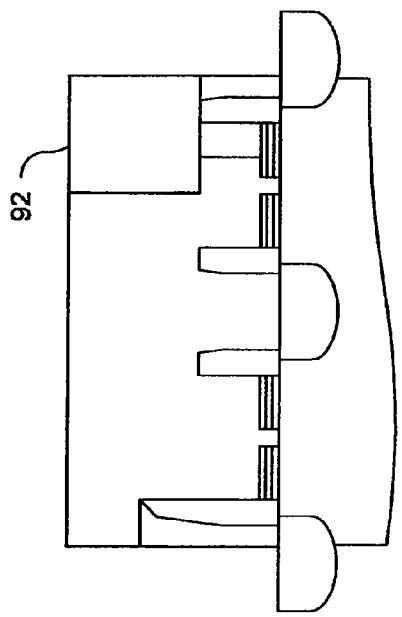
FIGS. 12A-12C include a plan view and cross sectional views of the array in the stage of forming gate control contacts and bit line contacts.
Figure 12C:
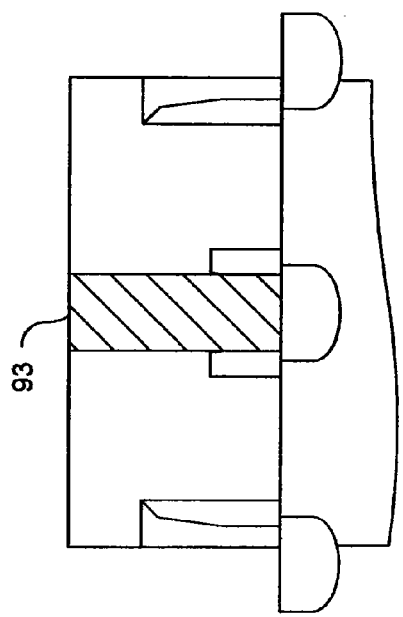
Figure 12A:
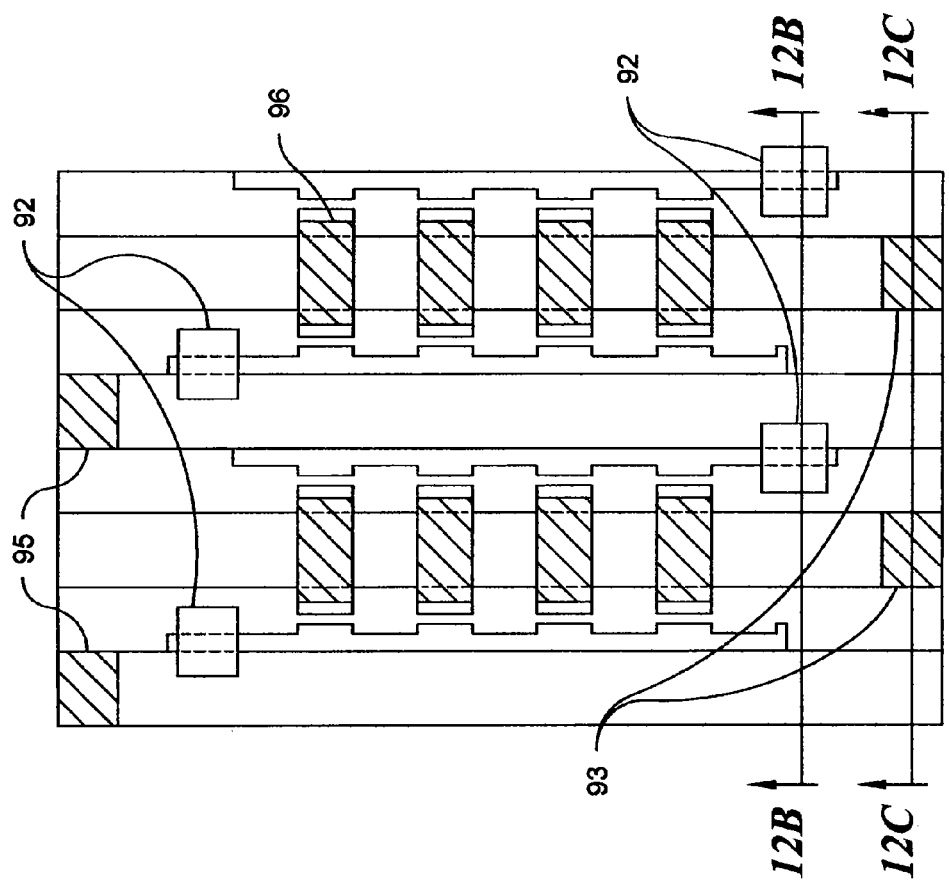

FIG. 3 shows an electrical schematic of an array 80 of at least one row and at least one column of the memory elements 70 in which the cells 10 in each row are connected source 16-to-source 16 and drain 14-to-drain 14. Each first gate 20a in each column is connected to one of a plurality of gate control lines (SG) 36 and each second gate in each row is connected to a word line 34. Also shown in FIG. 3 are drain bit lines (BD) 76 connecting together the drain 14 of each cell 10 in each column and source bit lines (BS) 78 connecting together the source 16 of each cell 10 in each column. As would be clear to one skilled in the art, the array 80 (not shown) is not limited in size to the four memory elements 70 shown in FIG. 3 but may be extended using known methods in the row direction and in the column direction by repeating the memory element 70 to form the memory array 80 having a size limited only by practical considerations.

Referring now to FIGS. 4-15 there is shown a preferred process for making the array 80 according to a preferred embodiment. At step 102, (see FIG. 5B) a charge trapping layer 18 consisting of a first silicon oxide layer (O1) 24, a silicon nitride layer (N) 26, a second silicon oxide layer (O2) 28; a polycrystalline-silicon layer (poly-Si) 30; a metal-silicide (MS) layer 32; and a silicon nitride hard mask layer (SiN) 72 are successively deposited on a P-type silicon substrate 12 wafer using any one of techniques known to those skilled in the art. Preferably, the charge trapping layer 18 is be formed by furnace chemical vapor deposition (CVD) at the temperature range of about 800~1000° C. with the known reactive gases. Preferably, a post deposition treatment, including the $N_2O$ annealing or the $N_2$ implantation, is used to form a superior silicon nitride layer 26. The preferred approximate thickness of each of the layers is shown in Table 1.

TABLE I

| Layer | Thickness (nm.) |
|---|---|
| O1 | 3–15 |
| N | 5–10 |
| O2 | 5–15 |
| poly-Si | 30–150 |
| MS | 30–150 |
| SiN | 80–200 |

Alternatively, the charge trapping layer 18 may be replaced by ONONO, O(SiON)O and O(high k material)O layers, where the high k material could be for instance $HfO_2$, $Al_2O_3$ or $ZrO_2$ and still be within the spirit and scope of the invention. Also, the poly crystalline layer 30 could be either N+ doped or P+ doped and the metal-silicide layer 32 could be for instance $WSi_x$, $CoSi_x$, $TiSi_x$, or $NiSi_x$.

At step 104, photolithography with line pattern and stack etching is performed using reactive-ion-etching with multi-steps. The etching is through the SiN layer 72, the gate layer 20 comprising the metal silicide layer 32 and the polycrystalline layer 30, and the charge trapping layer 18, in order to pattern the charge trapping layer 18 into a plurality of columns as shown in FIGS. 5A-5C. The preferred chemistries for etching the SiN layer 72, the gate layer 20, and the charge trapping layer 18 are respectively F-based, C12/HBr-based, and F-based. At step 106, spacers 74, to function as a hard mask for further etching, as shown in FIGS. 5A and 5D, are deposited on the wafer using low-pressure chemical vapor deposition (LP-CVD) followed by an isotropic etching using a reactive-ion-etcher with F-based chemistries.

At step 108, carriers are implanted using an ion implantation process to form a drain bit line 76 and a source bit line 78 corresponding to each column 54 using the SiN layer 72 as a hard mask. (See FIGS. 6A-6B). Preferably, the concentration of carriers resulting from the ion implantation process is in the range of $10^{19}$ to $10^{20}/cm^3$.

At step 110, a high density plasma (HDP) dielectric 84 is deposited in the spaces over the bit lines 76, 78, the spacers 74 and the SiN layer 72a, 72b.

At step 112, a dielectric wet dip is performed, using preferably, a solvent of dilute HF, to partially remove the triangular shaped HDP dielectric 84 over the SiN layer 72a, 72b. Following removal of the triangular shaped HDP dielectric 84 over the SiN layer 72a, 72b, the SiN layer 72a, 72b is removed by a lift-off method using, preferably, a solvent of hot phosphoric acid. The hot phosphoric acid has high etching rate of SiN so that the SiN layer 72a, 72b is removed. At the same time, the remainder of the triangular shaped HDP dielectric 84 over the SiN layer 72a, 72b is removed due to the absence of the SiN layer 72a, 72b.

At step 114, a dielectric spacer 82 of, for instance, $SiO_x$, $SiO_xN_y$ or $SiN_x$ is deposited in the region vacated by the SiN layer 72a, 72b. (See FIGS. 7A-7B. At step 116, a dielectric filled nanospace 22 is formed by: (1) etching the dielectric spacer to form a central region 98 stopping at either the metal-silicide layer 32a, 32b or the poly-Si layer 30a, 30b (FIGS. 7A-7B); (2) further etching through metal-silicide layer 32a, 32b, and the poly-Si layer 30a, 30b to form the nanospace 22 (FIGS. 8A-8B), where preferably the etching is through the charge trapping layer 18a, 18b, but may stop on the charge trapping layer 18a, 18b; and (3) depositing a boro-phospho-silicate glass (BPSG), phosphorosilicate glass (PSG) or spin-on glass (SOG) glass inter-space dielectric 40 (FIGS. 9A-9B) over substantially all of the surface of the wafer including the nanospace 22. Alternative to depositing the BPSG, PSG or SOG inter-space dielectric 40, a poly-Si layer may be thermally oxidized followed by a dielectric layer or a low-pressure CVD oxide may be used.

In the preferred embodiment, the width (d) of the dielectric spacer 82 determines the width of the nanospace 22 such that if the width of poly-Si layer 30 between the spacers 74 is $\lambda$, and the width (d) of each portion of the dielectric spacer 82 is somewhat smaller than $\lambda/2$, the width of the nanospace 22 is $\lambda-2d+\Delta$, where delta includes the critical dimension change due to the differently controlled metal-silicide 32 and poly-Si 30 profiles. This means that if the critical dimension change can be well controlled, i.e. $\Delta\sim0$, the width of nanospace is decided by the thickness of the dielectric spacer 82.

Patterning of gate 1 20a and gate 2 20b is performed at step 118. In a first step, a photo-resist pattern is applied to form a hole-like pattern 90 such that the edge of the photo-resist covers part of gate 1 20a but leaves gate 2 20b fully exposed. (FIGS. 9A-9B). In a second step, the interstage dielectric 40 and the dielectric spacer 82 dielectric are each removed. At a third stage, the etchant is changed to remove the metal-silicide 32a, 32b and the poly-Si 30a, 30b but leave the interstage dielectric 40 in the nanospace 22 and the HDP dielectric 84 covering the drain bit line 76 and the source bit line 78. (FIGS. 10A-10C).

At step 120, an interlayer dielectric 42 is deposited over substantially all of the surface of the wafer (FIGS. 11A-11C). At step 122, (see FIGS. 12A-12C), photoresist is applied to distinguish the areas for word line contacts 96 and SG contacts 92: A reactive-ion-etching is performed stopping at the word lines 34 and gate control lines 36. The word line contacts 96 are formed by filling the etched out contact spaces with tungsten or copper. The word line contacts 96 partially land on gate 2 20b of the neighboring cells 10, thus electrically connecting together the gate 2 20b of the neighboring cells 10. Following the forming of the word line contacts 96 and the SG contacts 92, a second photoresist is applied to distinguish areas for the bit line contacts 93, 95. A reactive-ion-etching is performed stopping at the substrate 12. The bit line contacts 93, 95 are formed by filling the etched out contact spaces with tungsten or copper. Following the contact formation, the contacts are polished.

Figure 13B:
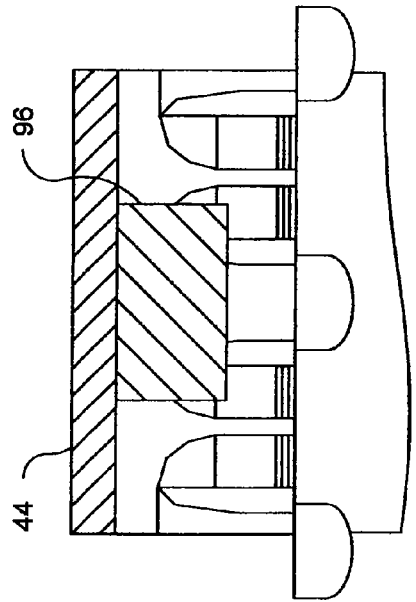
FIGS. 13A-13C include a plan view and cross sectional views of the array in the stage of a metal 1 deposition.
Figure 13C:
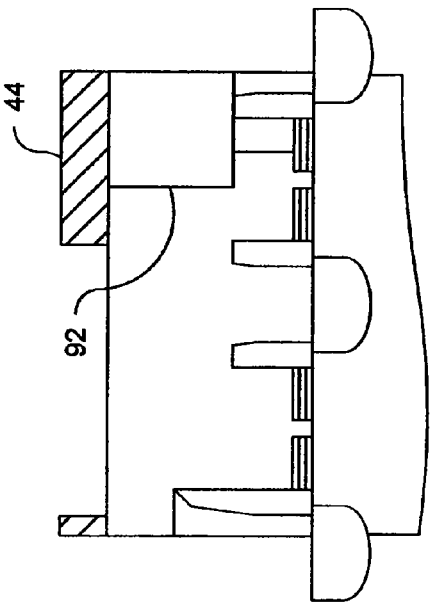
Figure 13A:
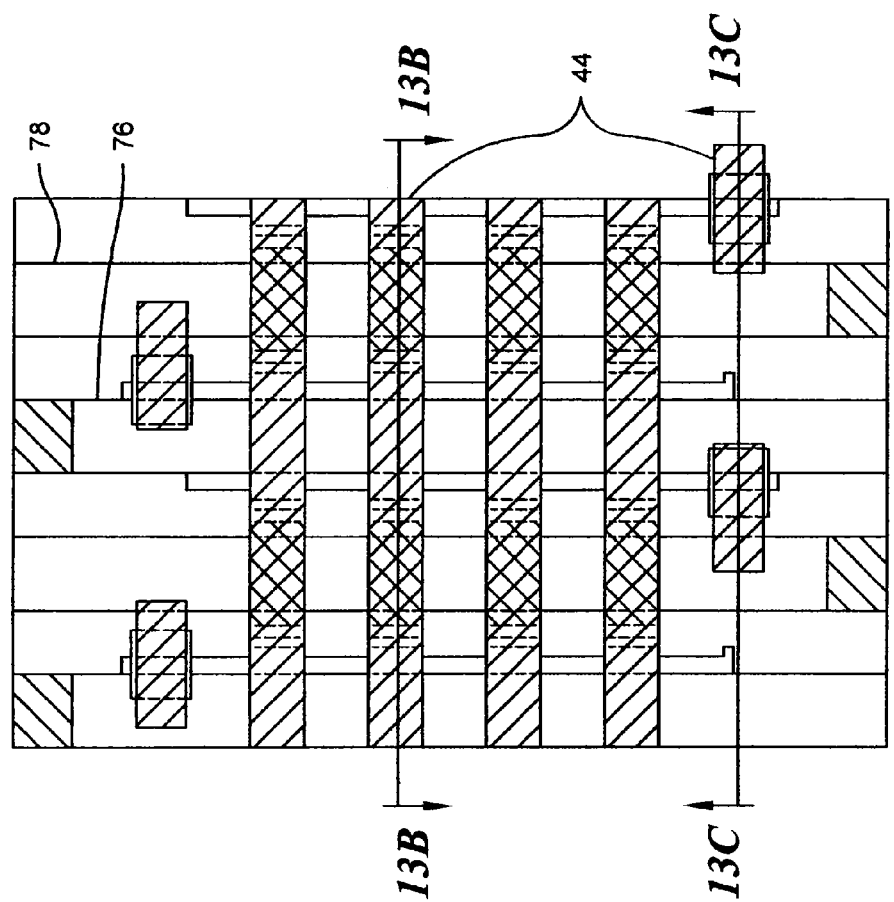
Figures 14A, 14B:
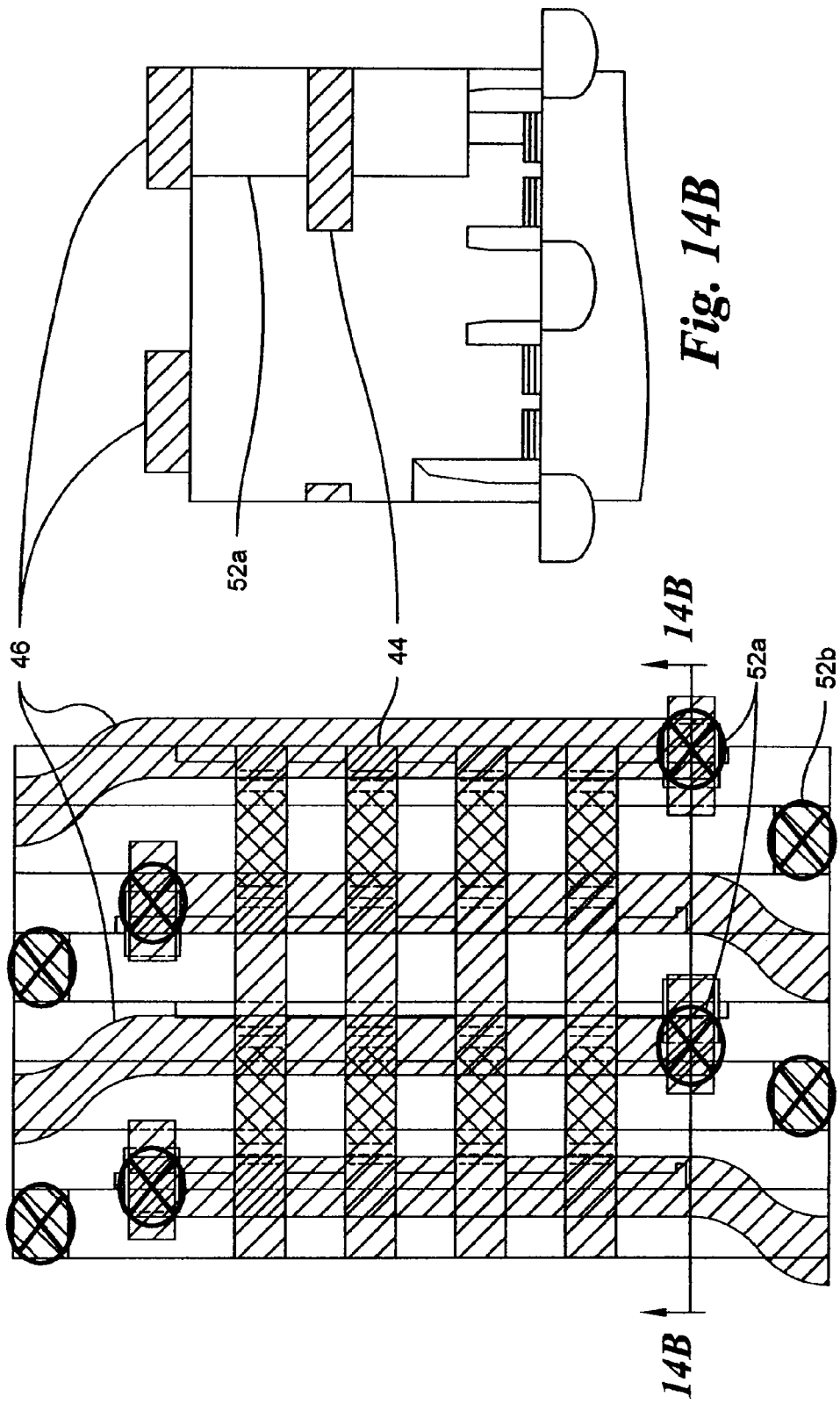
FIGS. 14A-14B include a plan view and a cross sectional view of the array in the stage of a metal 2 deposition.

Metal depositions 1, 2 and 3 are performed in step 124 with tungsten or copper, as shown in FIGS. 13-15. Preferably, a tungsten or copper chemical mechanical planarization (CMP) process is used after the deposition in the inter-metal dielectric metal trench. As shown in FIGS. 13 and 14, metal 1 44 is deposited on the interlayer dielectric 42 perpendicular to the buried diffusion bit lines 76, 78 for connecting to the word line contacts 96. Additionally, the metal 1 deposition 44 forms interconnection pads for connecting to the SG contacts 92, a first via 52a deposited on top of the interconnection pads for connecting the SG contacts to metal 2 46 and a second via 52b over the bit line contacts for connecting the bit lines (with a third via) to metal 3 48.

Following metal 1 deposition, a second interlayer dielectric 42 is deposited for forming the base for the metal 2 deposition 46. The metal 2 deposition 46 includes lines in the direction of the buried diffusion bit lines 76, 78 for connecting control signals to the gate control lines 36. Additionally, a third via 52c is formed from the second via 52b to connect the bit line contacts 93, 95 to the metal 3 deposition 48.

Figure 15B:
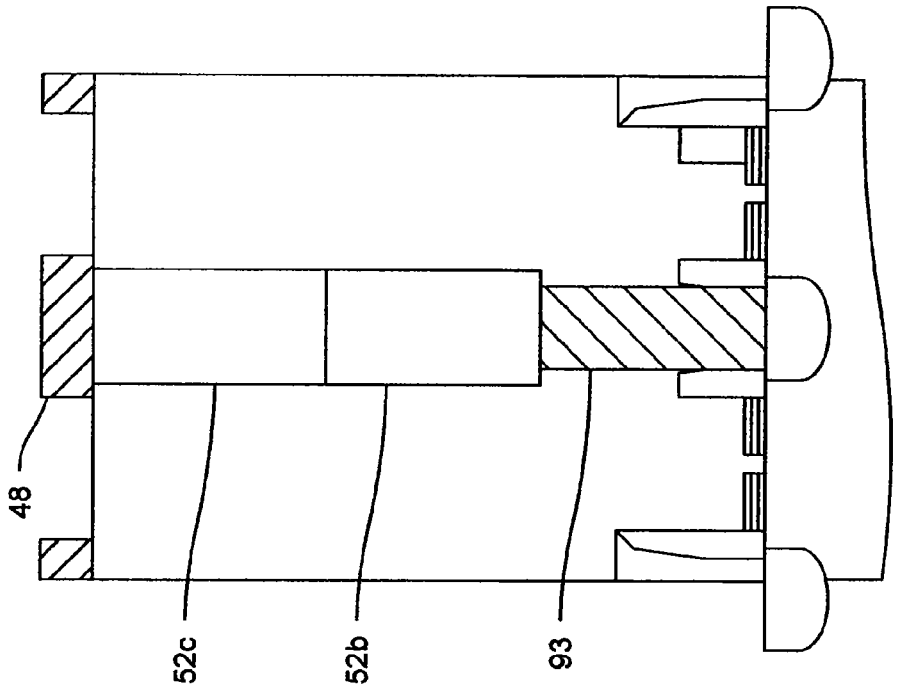
FIGS. 15A-15B include a plan view and a cross sectional view of the array in the stage of a metal 3 deposition.
Figure 15A:
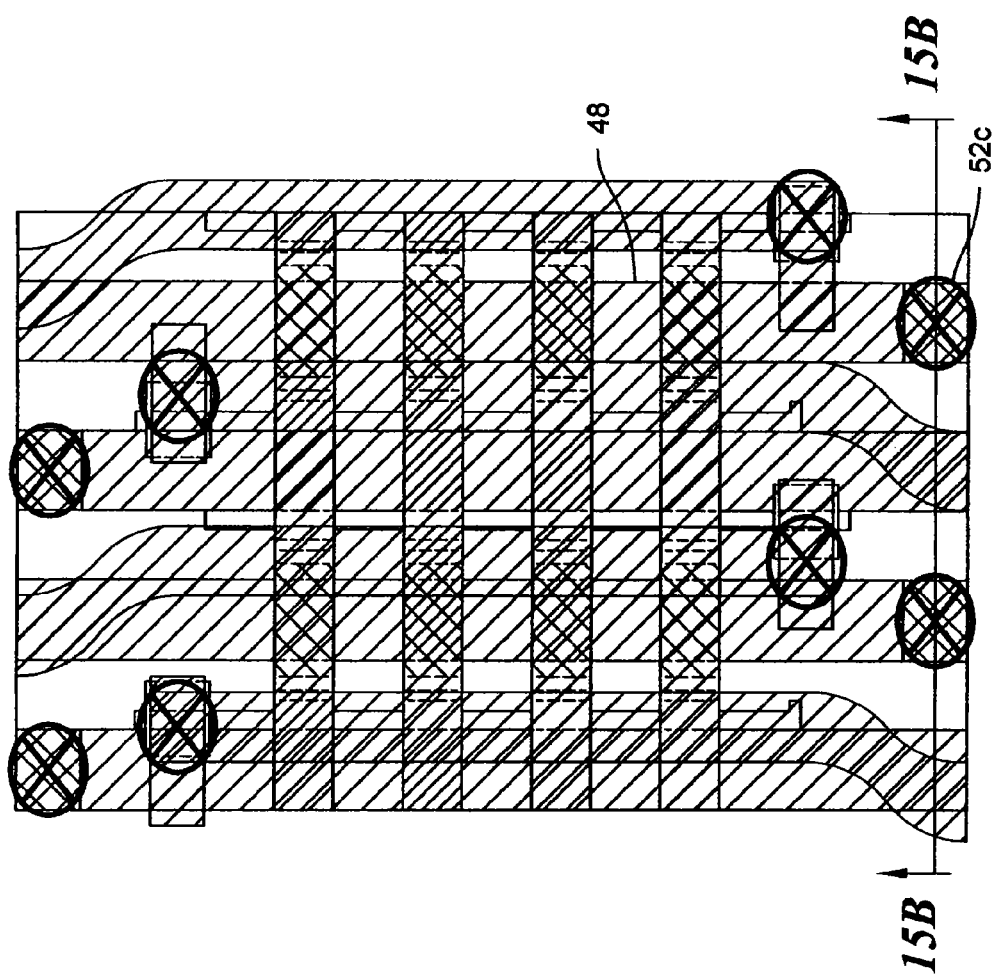

Following metal 2 deposition 46, a third interlayer dielectric 42 is deposited for forming the base for a metal 3 deposition 48. As shown in FIGS. 15A-15C, metal 3 lines are run over each bit line 76, 78 for carrying signals to the bit line contacts 93, 95.

As can be seen, the present invention provides an improved semiconductor memory array in which the second bit effect and the array effect are each reduced compared to memories employing multi-bit cells having only a single control gate.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. An array of memory cells arranged in columns and at least one row on a semiconductor substrate, the array comprising:

each memory cell having a drain region, a source region and only two gates consisted of a first gate and a second gate located between the drain region and the source region and a separation is located between the first gate and the second gate;

a plurality of gate control lines, each of which corresponds to one of the columns of the array of memory cells, wherein each control line connects to the first gate of the memory cell in the corresponding column in each of the at least one row; and at least one word line, each of which corresponds to one of the at least one row of the memory cells, each word line connected to the second gate of each of the memory cells in the corresponding row, wherein the first gate is above and contacts a first dielectric layer, the first dielectric layer is above and contacts a first charge storage region on the substrate, the second gate is above and contacts a second dielectric layer, the second dielectric layer on the substrate is above and contacts a second charge storage region.

2. The array of claim 1, further including:
a plurality of first bit lines, each of which corresponds to one of the columns of the memory cells, wherein each one of the first bit lines connects to the drain region of the memory cell in the corresponding column in each of the at least one row; and
a plurality of second bit lines, each of which corresponds to one of the columns of the memory cells, wherein each one of the second bit lines connects to the source region of the memory cell in the corresponding column in each of the at least one row.

3. The array of claim 2, wherein the plurality of first bit lines and the plurality of second bit lines are doped regions in the substrate.

4. The array of claim 3, wherein the doped regions are n+regions having a dosing level of between $10^{19}$ and $10^{20}/cm^3$.

5. The array of claim 1, wherein the first gate and the second gate each comprise a Poly-Si layer and a metal silicide layer.

6. The array of claim 1, wherein each of the first charge storage region and the second charge storage region includes a charge trapping layer, the charge trapping layer comprising a silicon nitride layer and a silicon dioxide layer.

7. The array of claim 1, wherein the first gate and the second gate are separated by a dielectric region, wherein an amount of the separation is between 10 and 40 nanometers.

8. The array of claim 7, wherein the amount of separation is approximately 30 nanometers.

9. The array of claim 1, wherein the control gate lines comprise a metal silicide deposition layer.

10. The array of claim 1, wherein the cells in each one of the at least one row are connected source-to-source and drain-to-drain.

11. An array of memory cells arranged in columns and at least one row on a semiconductor substrate, the array comprising:
each memory cell having a drain region, a source region, and only two gates consisted of a first gate and a second gate located between the drain region and the source region and a separation is located between the first gate and the second gate;
a plurality of gate control lines, each of which corresponds to one of the columns of the array of memory cells, wherein each control line connects to the first gate of the memory cell in the corresponding column in each of the at least one row; and
at least one word line, each of which corresponds to one of the at least one row of the memory cells, each word line connected to the second gate of each of the memory cells in the corresponding row, wherein the first gate is above a first charge storage region used for storing a first bit in the first charge storage region, and the second gate is above a second charge storage region used for storing a second bit in the second charge storage region.

12. The array of claim 11, further including:
a plurality of first bit lines, each of which corresponds to one of the columns of the memory cells, wherein each one of the first bit lines connects to the drain region of the memory cell in the corresponding column in each of the at least one row; and
a plurality of second bit lines, each of which corresponds to one of the columns of the memory cells, wherein each one of the second bit lines connects to the source region of the memory cell in the corresponding column in each of the at least one row.

13. The array of claim 12, wherein the plurality of first bit lines and the plurality of second bit lines are doped regions in the substrate.

14. The array of claim 13, wherein the doped regions are n+ regions having a dosing level of between $10^{19}$ and $10^{20}/cm^3$.

15. The array of claim 11, wherein the first gate and the second gate each comprise a Poly-Si layer and a metal silicide layer.

16. The array of claim 11, wherein each of the first charge storage region and the second charge storage region includes a charge trapping layer, the charge trapping layer comprising a silicon nitride layer and a silicon dioxide layer.

17. The array of claim 11, wherein the first gate and the second gate are separated by a dielectric region, wherein an amount of the separation is between 10 and 40 nanometers.

18. The array of claim 17, wherein the amount of separation is approximately 30 nanometers.

19. The array of claim 11, wherein the control gate lines comprise a metal silicide deposition layer.

20. The array of claim 11, wherein the cells in each one of the at least one row are connected source-to-source and drain-to-drain.

* * * * *